(12) United States Patent
Lee et al.

(10) Patent No.: US 9,420,709 B2
(45) Date of Patent: Aug. 16, 2016

(54) CORELESS BOARD FOR SEMICONDUCTOR PACKAGE, METHOD OF MANUFACTURING THE SAME, AND METHOD OF MANUFACTURING SEMICONDUCTOR PACKAGE USING THE SAME

(71) Applicant: SAMSUNG ELECTRO-MECHANICS CO., LTD., Suwon-si (KR)

(72) Inventors: Young Kwan Lee, Suwon-si (KR); Myung Sam Kang, Suwon-si (KR); Joo Hwan Jung, Suwon-si (KR); Ju Hee Park, Suwon-si (KR); Seung Yeop Kook, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/199,326

(22) Filed: Mar. 6, 2014

(65) Prior Publication Data

US 2015/0156865 A1 Jun. 4, 2015

(30) Foreign Application Priority Data

Dec. 3, 2013 (KR) .......... 10-2013-0149189

(51) Int. Cl.
| | |
|---|---|
| *H05K 1/11* | (2006.01) |
| *H05K 3/46* | (2006.01) |
| *H01L 23/13* | (2006.01) |
| *H05K 3/34* | (2006.01) |
| *H01L 23/538* | (2006.01) |
| *H01L 23/31* | (2006.01) |
| *H01L 23/00* | (2006.01) |

(52) U.S. Cl.
CPC .............. *H05K 3/4682* (2013.01); *H01L 23/13* (2013.01); *H01L 23/3121* (2013.01); *H01L 23/5389* (2013.01); *H01L 24/16* (2013.01); *H01L 2224/16225* (2013.01); *H01L 2224/16238* (2013.01); *H01L 2924/13055* (2013.01); *H01L 2924/15156* (2013.01); *H01L 2924/18161* (2013.01); *H05K 3/3452* (2013.01); *H05K 2201/0989* (2013.01); *H05K 2201/10674* (2013.01); *Y10T 29/49147* (2015.01)

(58) Field of Classification Search
CPC ....... H05K 3/28; H05K 3/429; H01L 2224/16
USPC ............... 174/255, 256, 260, 262; 29/830, 29/846–849
See application file for complete search history.

(56) References Cited

U.S. PATENT DOCUMENTS

| | | | | |
|---|---|---|---|---|
| 6,297,460 | B1 * | 10/2001 | Schaper .............. | H01L 23/5383 174/261 |
| 8,003,896 | B2 * | 8/2011 | Wu ........................ | H05K 1/115 174/260 |
| 2005/0088833 | A1 * | 4/2005 | Kikuchi et al. ................ | 361/763 |

(Continued)

FOREIGN PATENT DOCUMENTS

KR 2010-0111858 10/2010

*Primary Examiner* — Hoa C Nguyen
(74) *Attorney, Agent, or Firm* — NSIP Law

(57) ABSTRACT

Disclosed herein are a coreless board for a semiconductor package and a method of manufacturing the same. The coreless board for the semiconductor package includes: a support; a build-up layer formed on the support; an external connection terminal formed on the build-up layer; and a solder resist layer formed on the build-up layer so as to expose the external connection terminal.

20 Claims, 9 Drawing Sheets

(56) References Cited

U.S. PATENT DOCUMENTS

| | | | |
|---|---|---|---|
| 2006/0270211 A1* | 11/2006 | Nakamura et al. | 438/622 |
| 2007/0119619 A1* | 5/2007 | Nakamura et al. | 174/262 |
| 2009/0236131 A1* | 9/2009 | Mok | H05K 3/1258 174/257 |
| 2010/0139968 A1* | 6/2010 | Takenaka et al. | 174/263 |
| 2011/0169164 A1* | 7/2011 | Nakamura et al. | 257/739 |
| 2013/0098670 A1* | 4/2013 | Inoue et al. | 174/264 |
| 2013/0161079 A1* | 6/2013 | Maeda et al. | 174/255 |
| 2013/0333927 A1* | 12/2013 | Cho | H05K 1/032 174/255 |

* cited by examiner

CORELESS BOARD FOR SEMICONDUCTOR PACKAGE, METHOD OF MANUFACTURING THE SAME, AND METHOD OF MANUFACTURING SEMICONDUCTOR PACKAGE USING THE SAME

CROSS REFERENCE TO RELATED APPLICATION

This application claims the benefit of Korean Patent Application No. 10-2013-0149189, filed on Dec. 3, 2013, entitled "Coreless Board for Semiconductor Package, Method of Manufacturing the Same, and Method of Manufacturing Semiconductor Package Using the Same", which is hereby incorporated by reference in its entirety into this application.

BACKGROUND OF THE INVENTION

1. Technical Field

The present invention relates to a coreless board for a semiconductor package, a method of manufacturing the same, and a method of manufacturing the semiconductor package using the same.

2. Description of the Related Art

In accordance with the recent development of electronic industries, a demand for multi-functional and light and small electronic components has been rapidly increased. Therefore, there is a need to increase a wiring density of a printed circuit board on which the electronic components are mounted and reduce a thickness thereof.

In particular, in order to cope with the thinness of the printed circuit board, a coreless substrate with the reduced thickness and s signal processing time by removing a core substrate has been spotlighted. In case of the coreless board, since the core substrate is removed, a carrier member serving as a support during a manufacturing process is required. Buildup layers including circuit layers and insulating layers are formed on both surfaces of the carrier member by a general method of manufacturing a board and the carrier member is then removed to separate upper and lower substrates from each other, such that the coreless board is completed.

PRIOR ART DOCUMENT

Patent Document (Patent Document 1) Korean Patent Laid-Open Publication No. 2010-0111858

SUMMARY OF THE INVENTION

The present invention has been made in an effort to provide a coreless board for a semiconductor package capable of preventing warpage of a board by adhering a support onto one surface of a coreless product to perform an assembly, and a method of manufacturing the same.

The present invention has been made in an effort to provide a coreless board for a semiconductor package capable of miniaturizing a board using a photosensitive insulating material, and a method of manufacturing the same.

According to a preferred embodiment of the present invention, there is provided a coreless board for a semiconductor package, the coreless board including: a support; a build-up layer formed on the support; an external connection terminal formed on the build-up layer; and a solder resist layer formed on the build-up layer so as to expose the external connection terminal.

The build-up layer may include a plurality of circuit layers and an insulating layer formed between the plurality of circuit layers.

The insulating layer may be photosensitive.

The coreless board may further include a via electrically connecting the plurality of circuit layers to each other.

The via may be formed by exposing and developing processes.

The support may be made of an epoxy.

According to another preferred embodiment of the present invention, there is provided a method of manufacturing a coreless board for a semiconductor package, the method including: preparing supports adhered onto both surfaces of an adhesive; forming a build-up layer on the support; forming an external connection terminal on the build-up layer; and forming a solder resist on the build-up layer so as to expose the external connection terminal.

The build-up layer may include a plurality of circuit layers and an insulating layer formed between the plurality of circuit layers.

The insulating layer may be photosensitive.

The method may further include forming a via electrically connecting the plurality of circuit layers to each other.

The via may be formed by exposing and developing processes.

The support may be made of an epoxy.

According to still another preferred embodiment of the present invention, there is provided a method of manufacturing a semiconductor package, the method including: preparing a coreless board having a support formed on a lower surface thereof; mounting a semiconductor device on the coreless board; forming a molding portion on the coreless board so as to enclose the semiconductor device; and removing the support.

The coreless board may include a plurality of circuit layers and an insulating layer formed between the plurality of circuit layers.

The insulating layer may be photosensitive.

The method may further include forming a via electrically connecting the plurality of circuit layers to each other.

The via may be formed by exposing and developing processes.

The support may be made of an epoxy.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
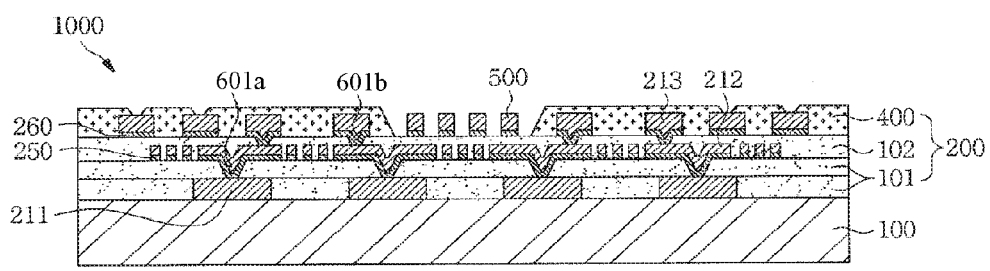
FIG. 1 is a cross-sectional view of a coreless board for a semiconductor package according to a preferred embodiment of the present invention.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, a preferred embodiment of the present invention will be described in detail with reference to the accompanying drawings.

Coreless Board for Semiconductor Package

As shown in FIG. 1, a coreless board 1000 for a semiconductor package may be configured to include a support 100, a build-up layer 200 formed on the support 100, an external connection terminal 500 formed on the build-up layer 200, and a solder resist layer 400 formed on the build-up layer 200 so as to expose the external connection terminal 500.

The coreless board 1000 for the semiconductor package, which is a substrate having one or more circuit layers formed thereon, may be a printed circuit board.

The support 100, which is a carrier, may be made of an organic type epoxy, or the like as a thin and rigid material, but is not particularly limited thereto.

The support 100 is formed on a lower portion of the build-up layer 200, thereby making it possible to prevent warpage at the time of performing an assembly.

Although not shown, the support 100 may be removed after the assembly.

Here, the build-up layer 200 may include a first circuit layer 211, a second circuit layer 212, and a third circuit layer 213, but may form one or more circuit layers according to a selection of those skilled in the art.

The circuit layer may be used without being limited as long as it is used as a conductive metal for a circuit in a field of a circuit board. In the printed circuit board, copper may be typically used.

In addition, since the circuit layers 211, 212 and 213 are formed by using a photosensitive resist, a fine circuit may be implemented.

In addition, the build-up layer 200 may include a first insulating layer 101 formed between the first circuit layer 211 and the second circuit layer 212 and a second insulating layer 102 formed between the second circuit layer 212 and the third circuit layer 213.

Here, the insulating layers 101 and 102 may be a photosensitive insulating layer.

In addition a via 601a electrically connecting the first circuit layer 211 and the second circuit layer 212 to each other may be formed and a via 601b electrically connecting the second circuit layer 212 and the third circuit layer 213 to each other may be formed. In this case, the vias 601a,b may be formed in a photo via scheme. That is, the vias 601a,b may be formed by exposing and developing the insulating layers 101 and 102. As clearly seen in FIGS. 1, 5, 11 and 18, the via hole in which upper via 601a is formed is narrower and shorter than the via hole in which the lower via 601b is formed.

Here, the vias 601a,b may be formed so as to penetrate through the photosensitive insulating layers 101 and 102. In addition, the vias 601a,b may be filled with a conductive material and may be made of the same material as the circuit layers 211, 212, and 213.

In addition, the external connection terminal 500 is defined as one formed at a position in the third circuit layer 213 which may be connected to the outside. That is, the external connection terminal 500, which is an exposed circuit layer, may further have a surface treatment layer (not shown) formed thereon as needed.

In this case, the surface treatment layer may be formed by, for example, electro gold plating, immersion gold plating, organic solderability preservative (OSP) or immersion tin plating, immersion silver plating, electroless nickel and immersion gold (ENIG), direct immersion gold (DIG) plating, hot air solder leveling (HASL) process, or the like, but is not particularly limited to the process as long as it is known in the art.

Although not shown, the external connection terminal 500 may be electrically connected to a lower package substrate in the case in which the board is used as an upper package substrate, and may be electrically connected to a main board in the case in which the board is used as the lower package substrate.

In addition, the solder resist layer 400 may be formed so as to enclose the third circuit layer 213 in order to expose the external connection terminal 500.

Method of Manufacturing Coreless Board for Semiconductor Package

FIGS. 2 to 18 are process flow charts of a method of manufacturing a coreless board for a semiconductor package according to another preferred embodiment of the present invention.

Figure 2:
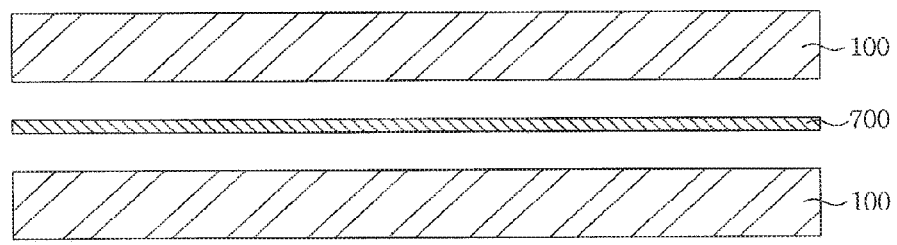
FIGS. 2 to 18 are process flow charts of a method of manufacturing a coreless board for a semiconductor package according to another preferred embodiment of the present invention.

As shown in FIG. 2, a support 100 is formed on both surfaces of a bonding material 700.

The support 100, which is a carrier, may be made of an organic type epoxy, or the like as a thin and rigid material, but is not particularly limited thereto.

Figure 3:
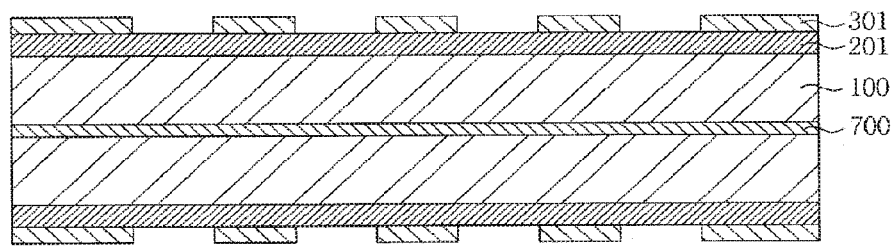

As shown in FIG. 3, a first metal layer 201 may be formed on the support 100. Here, the first metal layer 201 may be used without being limited as long as it is used as a conductive metal for a circuit. In the printed circuit board, copper may be typically used.

In addition, a photo resist 301 may be formed on the first metal layer 201. The photo resist 301 may be formed at a position desired by those skilled in the art.

In this case, the photo resist 301 may be a dry film resist.

Next, the first metal layer 201 having the photo resist 301 formed thereon may be exposed and developed.

Figure 4:
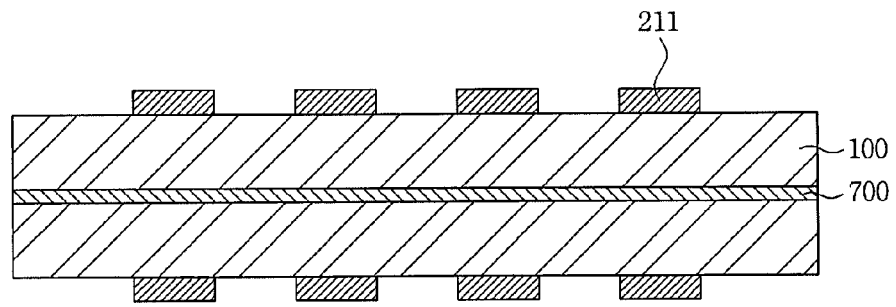

As shown in FIG. 4, after removing the photo resist 301, the remaining portions except for a circuit forming region may be patterned, thereby forming a first circuit layer 211.

In this case, since the first circuit layer 211 is formed by using a photosensitive resist, a fine circuit may be implemented.

Figure 5:
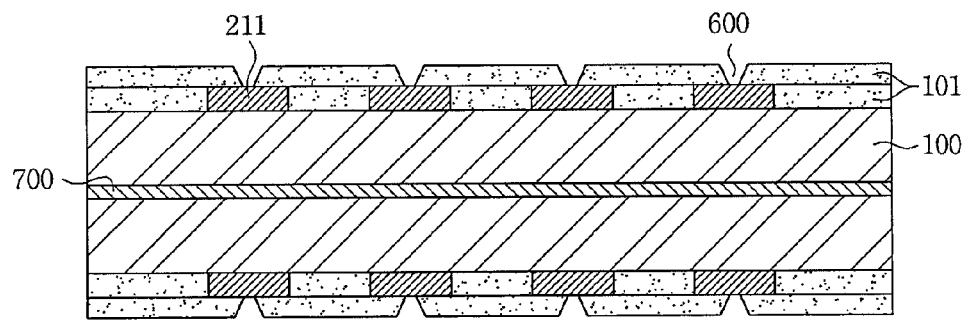

As shown in FIG. 5, a first insulating layer 101 may be formed on the first circuit layer 211. That is, the first insulating layer may be formed so as to cover an upper portion of the support 100 and the first circuit layer 211. Here, the first insulating layer 101 may be a photosensitive insulating layer.

In addition, a via hole 600 may be formed by exposing and developing the first insulating layer 101 formed at a position corresponding to the first circuit layer 211.

Figure 6:
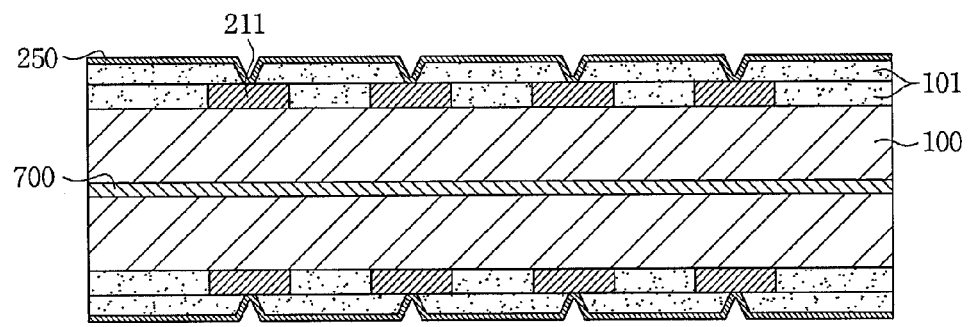

As shown in FIG. 6, a seed layer 250 may be formed along upper surfaces of the first insulating layer 101 and the via hole 600. The seed layer 250 may be formed by performing an immersion copper plating process.

Since the immersion copper plating is for an insulator, a reaction by electrically charged ions is not expected. The above-mentioned immersion copper plating is performed by a deposition reaction, wherein the deposition reaction is accelerated by a catalyst. In order to allow copper to be deposited from a plating solution, the catalyst needs to be attached to a surface of a material to be plated. This means that the immersion copper plating requires a plurality of pre-treatments.

As an example, the immersion copper plating process includes a cleanet process, a soft etching process, a pre-catalyst process, a catalyst treatment process, an accelerator process, an immersion copper plating process, and an anti-oxidation treatment process.

Figure 7:
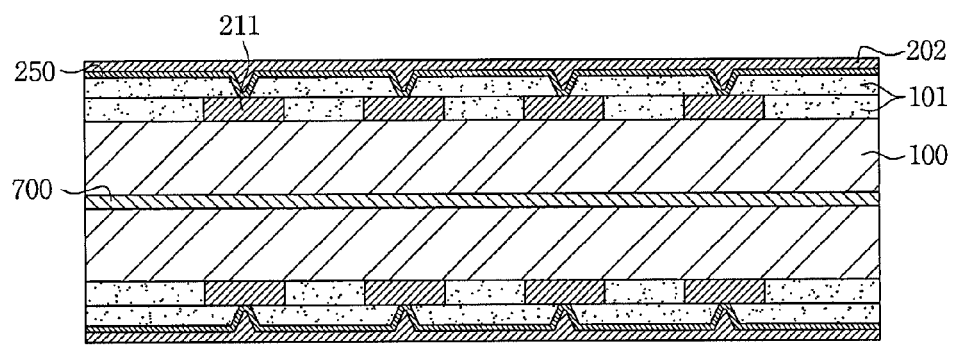

As shown in FIG. 7, a second metal layer 202 may be formed on the seed layer 250. Here, the second metal layer 202 may be used without being limited as long as it is used as a conductive metal for a circuit. In the printed circuit board, copper may be typically used.

Figure 8:
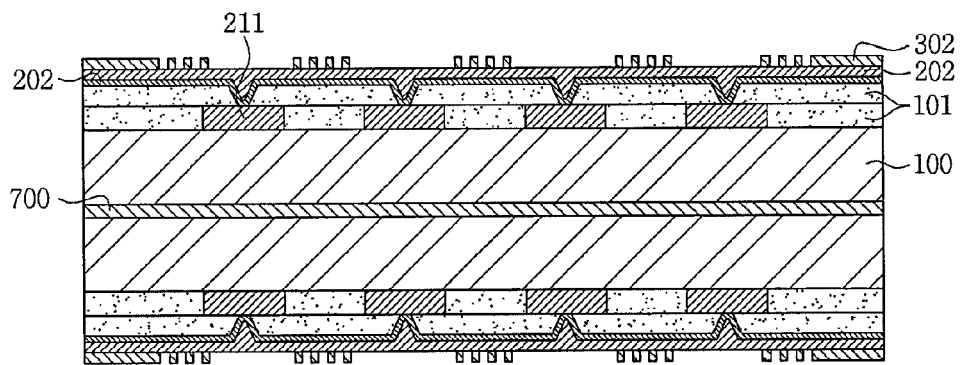

As shown in FIG. 8, a photo resist 302 may be formed on the second metal layer 202. The photo resist 302 may be formed at a position desired by those skilled in the art.

Next, the second metal layer 202 having the photo resist 302 formed thereon may be exposed and developed.

Figure 9:
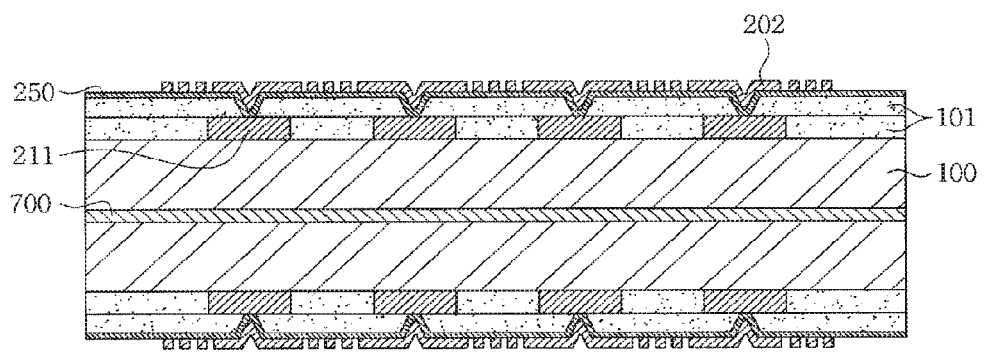

As shown in FIG. 9, after removing the photo resist 302, the remaining portions except for the circuit forming region may be patterned.

Figure 10:
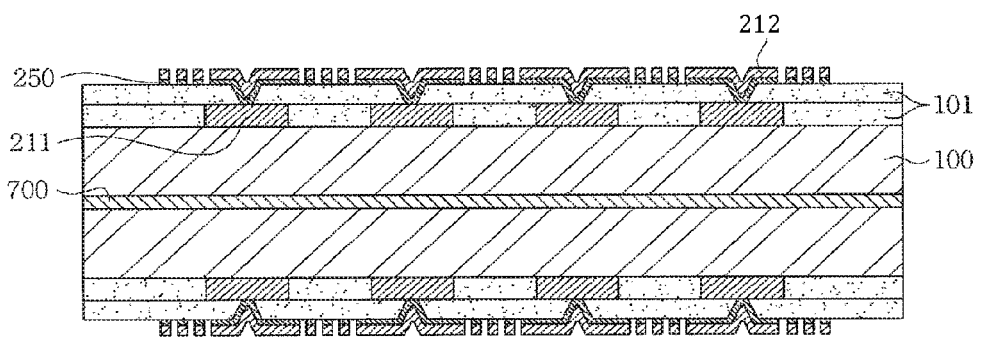

As shown in FIG. 10, a second circuit layer 212 may be formed by etching the seed layer 250. In addition, a via electrically connecting the first circuit layer 211 and the second circuit layer 212 to each other may also be formed.

In this case, since the second circuit layer 212 is formed by using a photosensitive resist, a fine circuit may be implemented.

Figure 11:
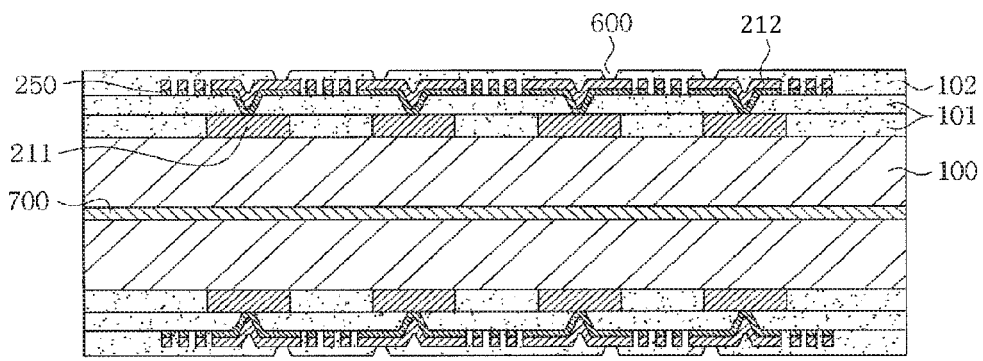

As shown in FIG. 11, a second insulating layer 102 may be formed on the second circuit layer 212. That is, the second insulating layer 102 may be formed so as to cover an upper portion of the support 100 and the second circuit layer 212. Here, the second insulating layer 102 may be a photosensitive insulating layer.

In addition, a via hole 600 may be formed by exposing and developing the first insulating layer 101 formed at a position corresponding to the first circuit layer 211.

Figure 12:
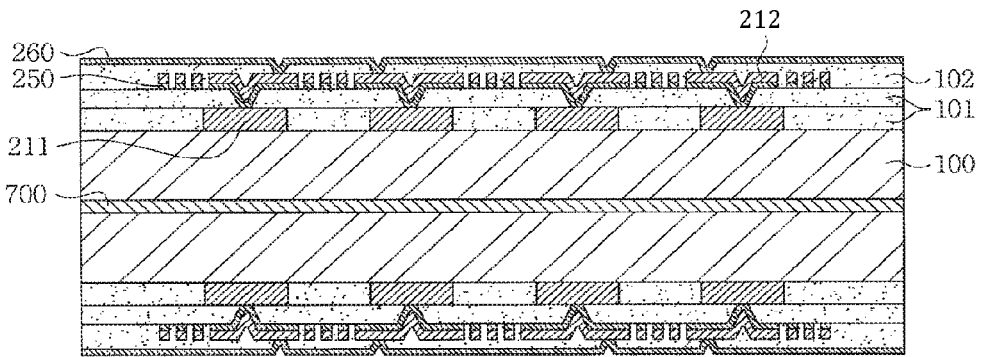

As shown in FIG. 12, a seed layer 260 may be formed along upper surfaces of the second insulating layer 102 and the via hole 600. The seed layer 260 may be formed by performing an immersion copper plating process.

Figure 13:
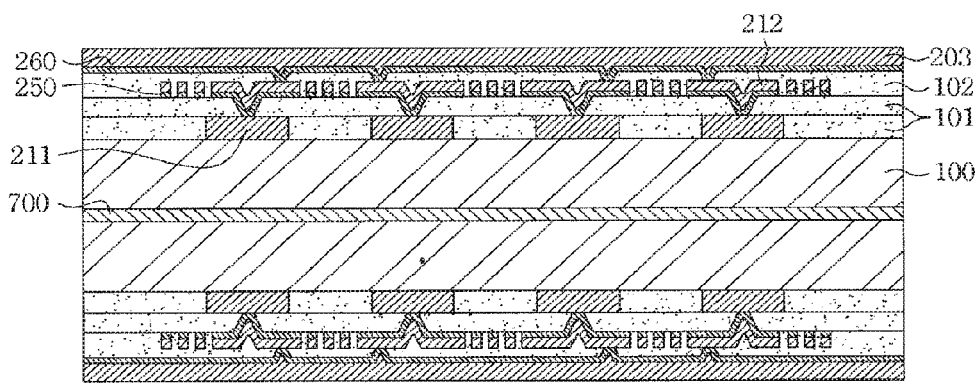

As shown in FIG. 13, a third metal layer 203 may be formed on the seed layer 260. Here, the third metal layer 203 may be used without being limited as long as it is used as a conductive metal for a circuit. In the printed circuit board, copper may be typically used.

Figure 14:
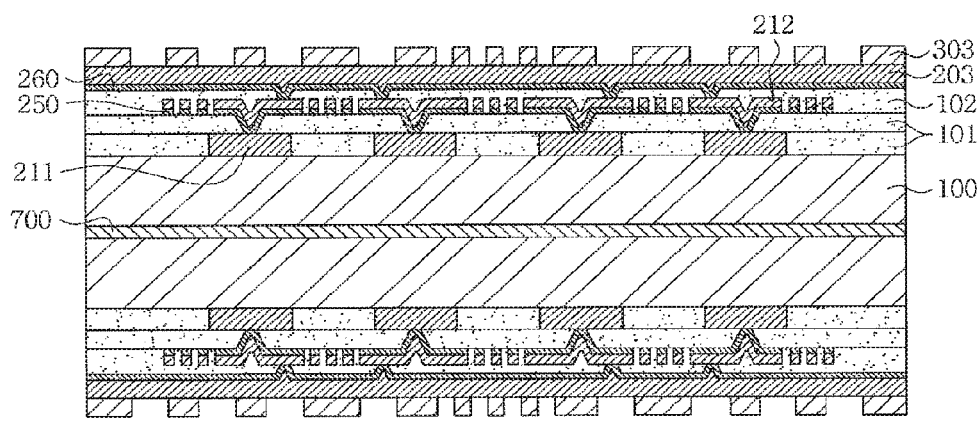

As shown in FIG. 14, a photo resist 303 may be formed on the third metal layer 203. The photo resist 303 may be formed at a position desired by those skilled in the art.

Next, the third metal layer 203 having the photo resist 303 formed thereon may be exposed and developed.

Figure 15:
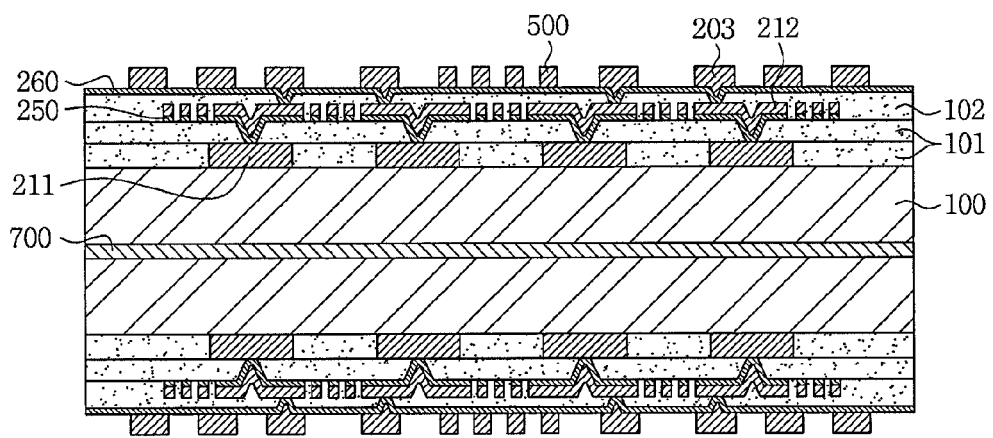

As shown in FIG. 15, after removing the photo resist 303, the remaining portions except for the circuit forming region may be patterned.

Figure 16:
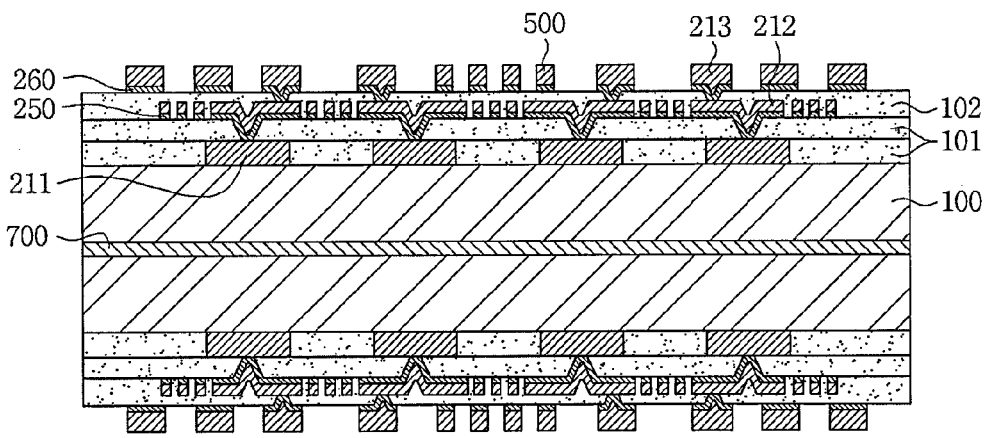

As shown in FIG. 16, a third circuit layer 213 and an external connection terminal 500 may be formed by etching the seed layer 260. In addition, a via electrically connecting the first circuit layer 211 and the second circuit layer 212 to each other may also be formed.

In this case, since the third circuit layer 213 is formed by using a photosensitive resist, a fine circuit may be implemented.

Here, the external connection terminal 500, which is an exposed circuit layer, may further have a surface treatment layer (not shown) formed thereon, as needed.

In this case, the surface treatment layer may be formed by, for example, electro gold plating, immersion gold plating, organic solderability preservative (OSP) or immersion tin plating, immersion silver plating, electroless nickel and immersion gold (ENIG), direct immersion gold (DIG) plating, hot air solder leveling (HASL) process, or the like, but is not particularly limited to the process as long as it is known in the art.

Although not shown, the external connection terminal 500 may be electrically connected to a lower package substrate in the case in which the board is used as an upper package substrate, and may be electrically connected to a main board in the case in which the board is used as the lower package substrate.

Figure 17:
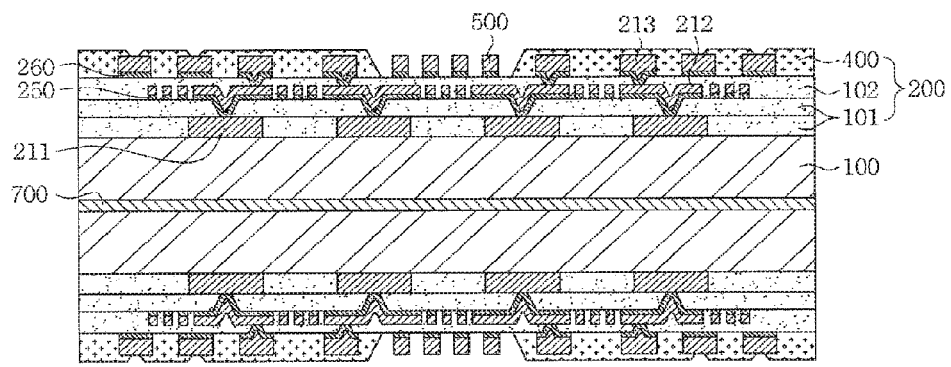

As shown in FIG. 17, a solder resist layer 400 may be formed so as to enclose the third circuit layer 213 in order to expose the external connection terminal 500.

In this case, a via hole may be further formed at a position corresponding to the third circuit layer 213 on the solder resist layer 400.

Figure 18:
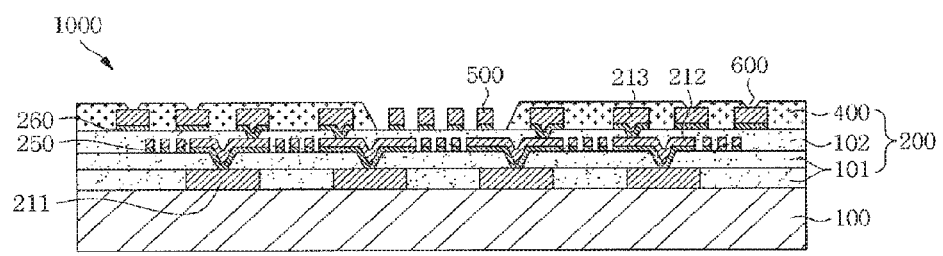

As shown in FIG. 18, after separating the support 100, the bonding material may be removed.

According to the present invention, the assembly may be performed in a state in which the support 100 is formed on the lower portion of the build-up layer 200.

Thereby, warpage of a thin plate may be prevented.

Method of Manufacturing Semiconductor Package

Figure 19:
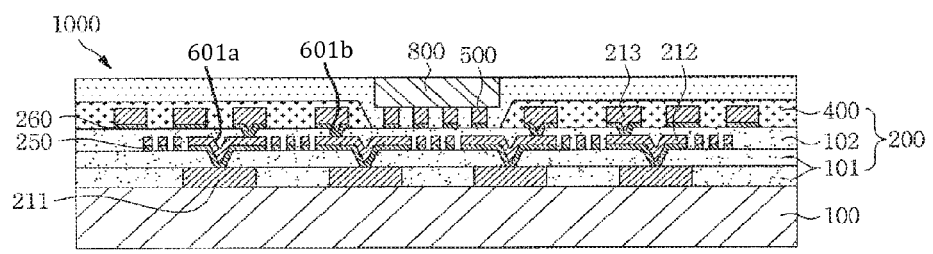
FIGS. 19 and 20 are process flow charts of a semiconductor package according to still another preferred embodiment of the present invention.
Figure 20:
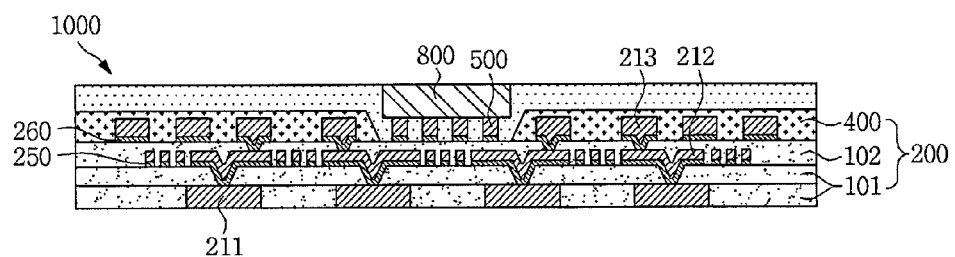

FIGS. 19 and 20 are process flow charts of a semiconductor package according to still another preferred embodiment of the present invention.

As shown in FIG. 19, a device 800 may be mounted on the coreless board 1000 for the semiconductor package having the support 100.

Here, the device 800 may be formed so as to be electrically connected to the external connection terminal 500.

In this case, the device 800 may include a power device and a control device, but is not limited thereto. For example, the power device may be a device having a large heating value such as an insulated gate bipolar transistor (IGBT), a diode, or the like, and the control device may be a device having a small heating value such as a control integrated circuit (IC).

In addition, a molding portion 900 may be formed so as to enclose an empty space between the external connection terminals 500 and a side of the device 800.

The molding portion 900 may increase adhesion between a molding material and the board 1000, such that a problem such as delamination between the board and the molding material is decreased, thereby making it possible to improve long-term reliability of the board.

In addition, since heat is blocked by the molding, a radiant heat effect may be further improved.

In this case, as a material of the molding portion 900, silicone gel, epoxy molded compound (EMC), or the like may be used. However, the molding material is not particularly limited thereto.

In addition, the coreless board 1000 for the semiconductor package, which is a substrate having one or more circuit layers formed thereon, may be a printed circuit board.

The support, which is a carrier, may be made of an organic type epoxy, or the like as a thin and rigid material, but is not particularly limited thereto.

Here, the build-up layer 200 may include a first circuit layer 211, a second circuit layer 212, and a third circuit layer 213, but may form one or more circuit layers according to a selection of those skilled in the art.

The circuit layer may be used without being limited as long as it is used as a conductive metal for a circuit in a field of a circuit board. In the printed circuit board, copper may be typically used.

In addition, since the circuit layers 211, 212 and 213 are formed by using a photosensitive resist, a fine circuit may be implemented.

In addition, the build-up layer 200 may include a first insulating layer 101 formed between the first circuit layer 211 and the second circuit layer 212 and a second insulating layer 102 formed between the second insulating layer 212 and the third circuit layer 213.

Here, the insulating layers 101 and 102 may be a photosensitive insulating layer.

In addition a via 601a electrically connecting the first circuit layer 211 and the second circuit layer 212 to each other may be formed and a via 601b electrically connecting the second circuit layer 212 and the third circuit layer 213 to each other may be formed. In this case, the vias 601a,b may be formed in a photo via scheme. That is, the vias 601a,b may be formed by exposing and developing the insulating layers 101 and 102. As clearly seen in FIGS. 19 and 20, the via hole in which upper via 601a is formed is narrower and shorter than the via hole in which the lower via 601b is formed.

Here, the vias 601a,b may be formed so as to penetrate through the photosensitive insulating layers 101 and 102. In addition, the vias 601a,b may be filled with a conductive material and may be made of the same material as the circuit layers 211, 212, and 213.

In addition, the external connection terminal 500 is defined as one formed at a position in the third circuit layer 213 which may be connected to the outside.

As shown in FIG. 20, the support 100 may be removed.

Thereby, the assembly is performed in the state in which the support is adhered onto one surface of the board, such that warpage of the board, which is the thin plate, may be prevented.

In the coreless board for the semiconductor package according to the preferred embodiment of the present invention, the assembly is performed in the state in which the support is adhered onto one surface of the coreless board, such that warpage of the board, which is the thin plate, may be prevented.

In addition, the thickness of the insulating layer may be decreased by using the photosensitive material and the fine circuit may be implemented by forming the circuit using the photosensitive resist.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A coreless board for a semiconductor package, the coreless board comprising:
    a build-up layer comprising circuit layers and insulating layers disposed between the circuit layers;
    a plurality of external connection terminals formed on the build-up layer;
    a solder resist layer formed on the build-up layer so as to expose the plurality of external connection terminals, the solder resist layer having an opening formed thereon in such a way that the opening exposes the plurality of external connection terminals;
    a first via hole disposed in a first insulating layer; and
    a second via hole disposed in a second insulating layer, the second insulating layer disposed closer to the external connection terminals than the first insulating layer,
    wherein a width and a height of the second via hole are smaller than those of the first via hole.

2. The coreless board as set forth in claim 1, wherein the second insulating layer is disposed adjacent to the first insulating layer.

3. The coreless board as set forth in claim 1, wherein the first and the second insulating layers are photosensitive.

4. The coreless board as set forth in claim 1, further comprising a via electrically connecting the circuit layers to each other.

5. The coreless board as set forth in claim 4, wherein the via is formed by exposing and developing processes.

6. The coreless board of claim 1, further comprising a support having the build-up layer formed thereon.

7. The coreless board as set forth in claim 6, wherein the support is made of an epoxy.

8. A method of manufacturing a coreless board for a semiconductor package, the method comprising:
    preparing at least one support adhered onto both surfaces of a bonding material;
    forming a build-up layer on the support, the build-up layer comprising circuit layers and insulating layers disposed between the circuit layers;
    forming a plurality of external connection terminals on the build-up layer;
    forming a solder resist on the build-up layer so as to expose the plurality of external connection terminals, the solder resist layer having an opening formed thereon in such a way that the opening exposes the plurality of external connection terminals;
    forming a first via hole in a first insulating layer; and
    forming a second via hole disposed in a second insulating layer, the second insulating layer disposed closer to the external connection terminals than the first insulating layer,
    wherein a width and a height of the second via hole are smaller than those of the first via hole.

9. The method as set forth in claim 8, wherein the second insulating layer is disposed adjacent to the first insulating layer.

10. The method as set forth in claim 8, wherein the first and the second insulating layers are photosensitive.

11. The method as set forth in claim 8, further comprising forming a via electrically connecting the circuit layers to each other.

12. The method as set forth in claim 11, wherein the via is formed by exposing and developing processes.

13. The method as set forth in claim 8, wherein the support is made of an epoxy.

14. The method of claim 8, further comprising removing the support.

15. A method of manufacturing a semiconductor package, the method comprising:
    preparing a coreless board having a support formed on a lower surface thereof;
    mounting a semiconductor device on the coreless board;
    forming a molding portion on the coreless board so as to enclose the semiconductor device; and
    removing the support,
    wherein the coreless board comprises:

a build-up layer comprising circuit layers and insulating layers disposed between the circuit layers;

a plurality of external connection terminals formed on the build-up layer and connected to the semiconductor device;

a solder resist layer formed on the build-up layer so as to expose the plurality of external connection terminals, the solder resist layer having an opening formed thereon in such a way that the opening exposes the plurality of external connection terminals;

a first via hole disposed in a first insulating layer; and a second via hole disposed in a second insulating layer, the second insulating layer disposed closer to the external connection terminals than the first insulating layer, wherein a width and a height of the second via hole are smaller than those of the first via hole.

16. The method as set forth in claim 15, wherein the second insulating layer is disposed adjacent to the first insulating layer.

17. The method as set forth in claim 15, wherein the first and the second insulating layers are photosensitive.

18. The method as set forth in claim 15, further comprising forming a via electrically connecting the circuit layers to each other.

19. The method as set forth in claim 15, wherein the via is formed by exposing and developing processes.

20. The method as set forth in claim 15, wherein the support is made of an epoxy.

* * * * *